(12) United States Patent
Deck et al.

(10) Patent No.: US 7,679,917 B2
(45) Date of Patent: Mar. 16, 2010

(54) ELECTRONIC ASSEMBLY COOLING

(76) Inventors: Joseph F. Deck, 9 High St., Somerville, MA (US) 02144; Bradley L. Hunter, 48 Peacock Farm Rd., Lexington, MA (US) 02421; Michael B. Nussbaum, 23 High St., Newton, MA (US) 02464; Steven D. Owen, 116 Main Blvd., Shrewsbury, MA (US) 01454

( * ) Notice: Subject to any disclaimer, the term of this patent is extended or adjusted under 35 U.S.C. 154(b) by 24 days.

(21) Appl. No.: 12/019,712

(22) Filed: Jan. 25, 2008

(65) Prior Publication Data
US 2008/0186681 A1 Aug. 7, 2008

Related U.S. Application Data

(60) Provisional application No. 60/887,970, filed on Feb. 2, 2007.

(51) Int. Cl.
*H05K 7/20* (2006.01)
*F28F 7/00* (2006.01)
*H01L 23/34* (2006.01)

(52) U.S. Cl. .............. 361/719; 165/80.2; 165/80.3; 165/185; 257/718; 257/179; 361/704

(58) Field of Classification Search .......... 257/718–719
See application file for complete search history.

(56) References Cited

U.S. PATENT DOCUMENTS

| | | | | |
|---|---|---|---|---|
| 4,517,624 | A * | 5/1985 | Wessely | 361/706 |
| 4,887,147 | A * | 12/1989 | Friedman | 174/252 |
| 5,065,280 | A * | 11/1991 | Karnezos et al. | 361/715 |
| 5,305,185 | A * | 4/1994 | Samarov et al. | 361/704 |
| 6,365,964 | B1 * | 4/2002 | Koors et al. | 257/718 |
| 6,472,742 | B1 | 10/2002 | Bhatia et al. | |
| 6,700,195 | B1 * | 3/2004 | Mandel | 257/718 |
| 6,939,742 | B2 | 9/2005 | Bhatia et al. | |
| 7,162,793 | B2 * | 1/2007 | Kintis et al. | 29/757 |

* cited by examiner

*Primary Examiner*—Gregory D Thompson
(74) *Attorney, Agent, or Firm*—Bose Corporation

(57) ABSTRACT

An electronic assembly including a first heat producing device mounted on a first outer surface of a first portion of a circuit board. The first portion can deflect upwardly and downwardly relative to other portions of the circuit board. A first force element urges the first heat producing device against a heat sink. The force exerted by the first force element is variable with respect to time.

20 Claims, 7 Drawing Sheets

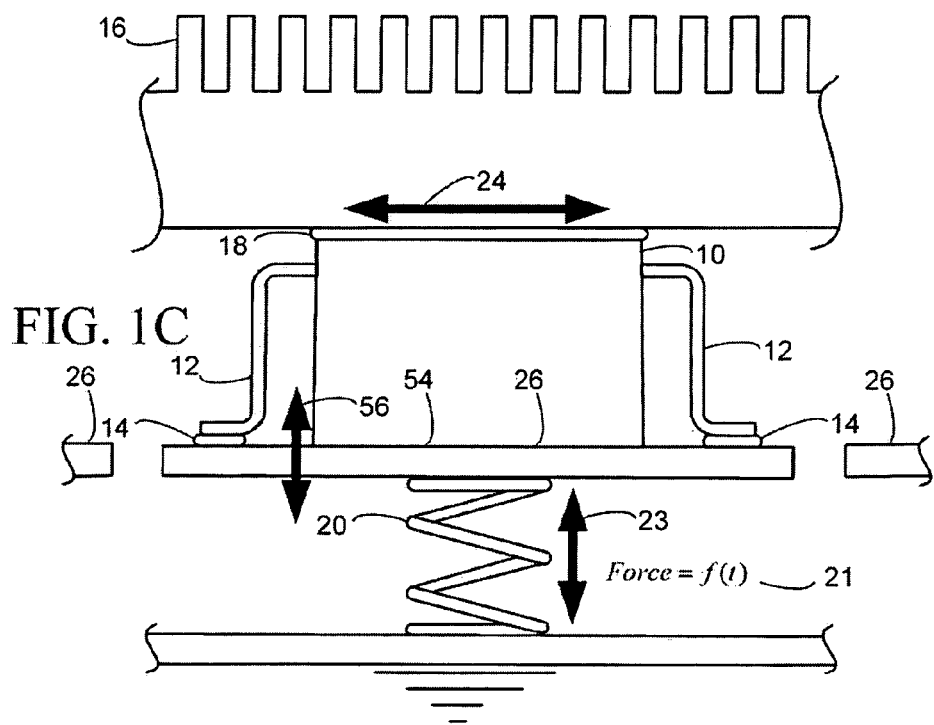

US 7,679,917 B2

ELECTRONIC ASSEMBLY COOLING

This application claims priority under 35 U.S.C. 119(e) to U.S. Provisional Application 60/887,970, filed Feb. 2, 2007 and incorporated by reference in its entirety.

BACKGROUND

This specification describes an electronic assembly for heat producing device cooling and more particularly to cooling of semiconductor chips mounted on circuit boards.

SUMMARY

In one aspect an electronic assembly, includes a first heat producing device mounted on a first outer surface of a first portion of a circuit board. The first portion can deflect upwardly and downwardly relative to other portions of the circuit board. The electronic assembly also includes a first force element for urging the first heat producing device against a heat sink. The force exerted by the first force element is variable with respect to time. The first portion of the circuit board may be a cantilevered projection. The force element may be a compressible foam. The force element may be a silicone spring. The silicone spring may have a negative spring rate over a portion of its displacement. The electronic assembly may further include a second heat producing device mounted on a first outer surface of a second portion of the circuit board. The first and second portions can deflect upwardly and downwardly relative to each other and to other portion of the circuit board. The electronic assembly may also include a second force element for urging the second heat producing device against a heat sink. The force exerted by the second force element may be variable with respect to time. The first force element and the second force element may include a silicone spring. The silicone spring may have a negative spring rate over a portion of its displacement. The first force element and the second force element may be different areas of a compressible pad. The first force element and the second force element may include compressible pads. The compressible pads may include a silicone foam. The first force element may exert the force against a second outer surface of the first portion opposite the first outer surface. The first force element may have a property that if subjected to a temperature of 125° C. for 1522 hours, the force element exerts a pressure that is less than 75% of an initial pressure. The first force element may have a property that if subjected to a temperature of 125° C. for 1522 hours, the force element exerts a pressure that is less than 45% of an initial pressure.

In another aspect, an audio amplifier includes a first power amplifier chip mounted on a first outer surface of a first portion of a circuit board; a second power amplifier chip mounted on the first outer surface of a second portion of the circuit board so that the first portion and the second portion can deflect upwardly and downwardly relative to each other; and a force source includes a non-metallic material and is adjacent a second outer surface of a circuit board to urge the first power amplifier chip and the second amplifier chip against a heat sink with a force that is variable with respect to time. The force source may include a silicone spring. The silicone spring may have a negative spring rate over a portion of its displacement. The force source may include a sheet of silicone foam. The force source may have a property that if subjected to a temperature of 125° C. for 1522 hours, the force element exerts a pressure that is less than 75% of an initial pressure. The compressible pad may have a property that if subjected to a temperature of 125° C. for 1522 hours, the force element exerts a pressure that is less than 45% of an initial pressure.

Other features, objects, and advantages will become apparent from the following detailed description, when read in connection with the following drawing, in which:

BRIEF DESCRIPTION OF THE SEVERAL VIEWS OF THE DRAWING

FIGS. 1A-1D and 1I are diagrammatic partial cross sections of an electronic assembly;

DETAILED DESCRIPTION

Figure 1A:
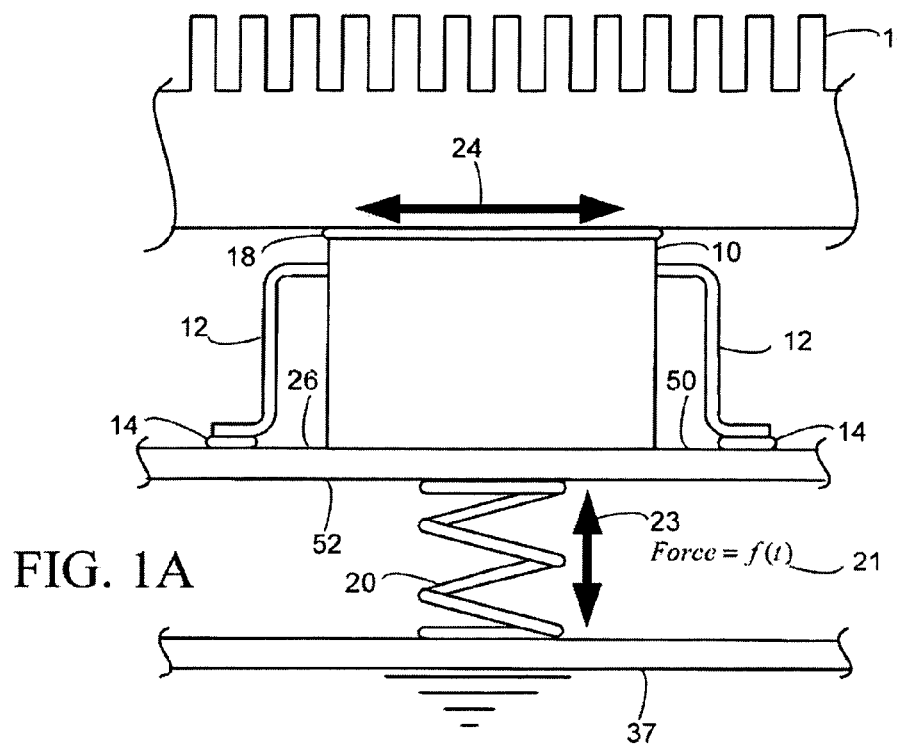

FIG. 1A shows an electronic assembly, for example a portion of an audio amplifier. A heat producing device 10, for example a power amplifier chip has leads 12 that are mechanically and electrically coupled to a first outer surface 50 of circuit board 26 by solder joints 14. The heat producing device 10 is thermally coupled to a heat sink 16 by a thermal interface 18. A force element 20, applies a force (as indicated by arrow 23) between a second outer surface 52 of the circuit board 26 and a mechanical ground 37 in the vicinity of the heat producing device 10, urging the heat producing device toward the heat sink. The force applied by the force element may be variable with respect to time, as indicated by the equation 21 and as will be discussed below. The force element is schematically represented as a compressed spring, but may be one of many other force sources, some of which will be described later.

The heat produced by the heat producing device 10 is conducted to the external environment by the heat sink 16. For the heat sink to operate efficiently, it is beneficial for the thermal interface 18 (for example thermal grease or a thermally conductive conformable pad) to be well "wetted" with the both the heat sink 16 and the heat producing device 10, that is to cover as much of the surface area between the heat sink 16 and the heat producing device 10 as possible. It is also beneficial that any non-planarities (for example scratches, irregular surface finishes, or microscopic irregularities) are filled so that there are no air pockets between the heat sink 16 and the heat producing device 10 and so that there is a continuous thermal path with low thermal impedance between heat sink 16 and the heat producing device 10.

The force element 20 urges the heat producing device toward the heat sink to assist the wetting process. Additionally, the force element helps to maintain thermal contact between the heat producing device 10 and the heat sink 16 by urging the heat producing device toward the heat sink. The amount of pressure (hereinafter the wetting pressure) applied by the force (hereinafter "wetting force") that is desirable for assisting the wetting process is greater than the amount of pressure (hereinafter "maintenance pressure") applied by the force (hereinafter "maintenance force") that is required to maintain thermal contact between the heat producing device 10 and the heat sink 16. Once the wetting pressure has been applied, only the lesser maintenance pressure is necessary.

When the electronic assembly is operating, too much pressure applied by the force element 20 is disadvantageous. Some components of the assembly, such as the heat sink 16 and the circuit board 26 may have different coefficients of thermal expansion (CTE). Upon changes in temperature, these differences in CTE will result in mechanical stress being applied to the system. One of these stresses is shear stress applied to the interface between the device 10 and the heat sink 16 through the thermal interface 18. Another of these shear stresses is between the leads 12 and the circuit board surface 50 through the solder joint 14.

If the pressure applied by force element 20 is too great, the thermal interface may become less and less able to react to the shear stresses with shear strain, and all the shear stresses may be applied to the solder joint. These shear stresses can damage the leads 12 and the solder joints 14, which can cause the solder joints to lose mechanical or electrical coupling, or both, with the circuit board, causing the assembly to fail.

A desirable characteristic for the force element is that it provides adequate wetting pressure and, once the wetting pressure is applied, it provides only a lesser maintenance pressure. The arrangement of FIG. 1B has a force element 20' has such a characteristic. Force element 20' is a compressible pad or sheet of a silicone foam compressed by a nominal 44% between the outer surface of the circuit board 26 opposite the heat producing device 10 and a mechanical ground 37, for example a cover containing the electronic assembly of FIGS. 1A and 1B.

Figure 1B:
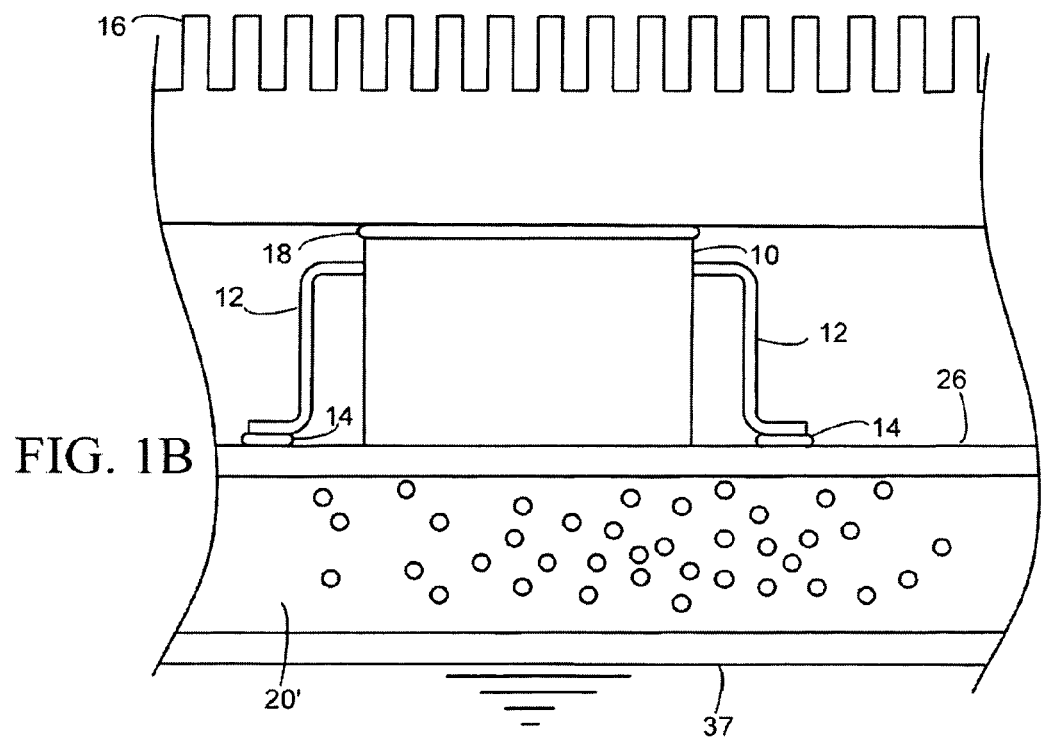
Figure 1D:
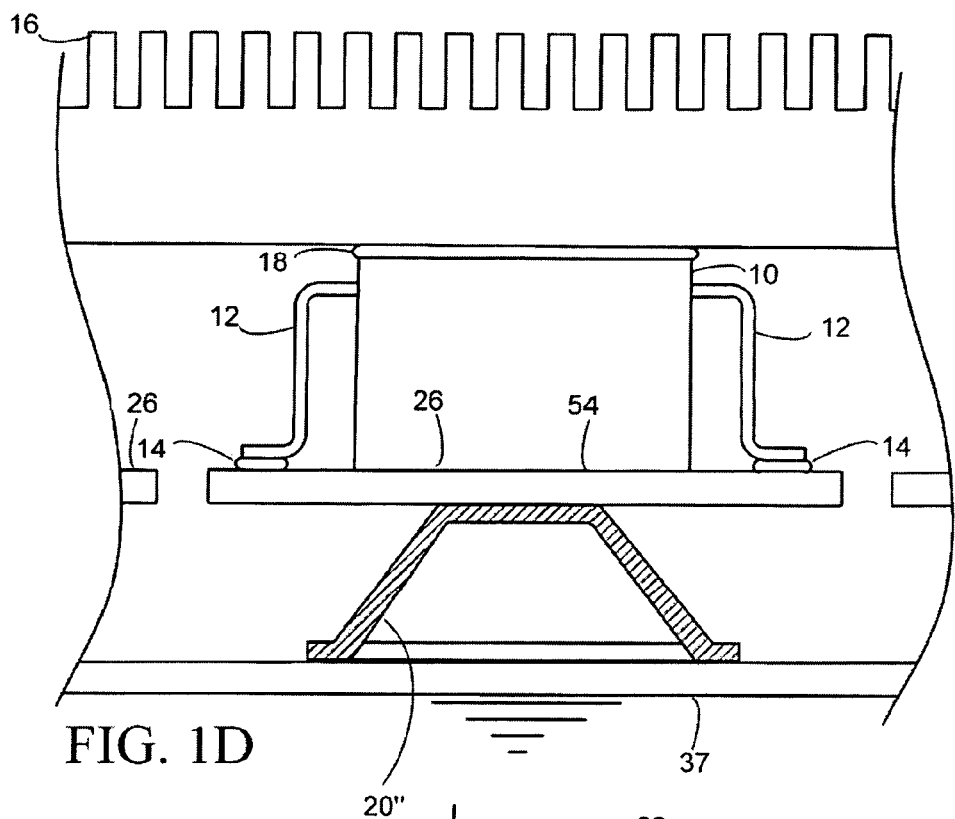
Figure 1E:
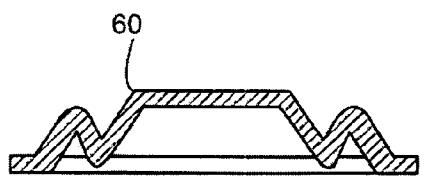
FIG. 1E is a diagrammatic cross section of a silicone spring illustrating a buckling mode.
Figure 1F:
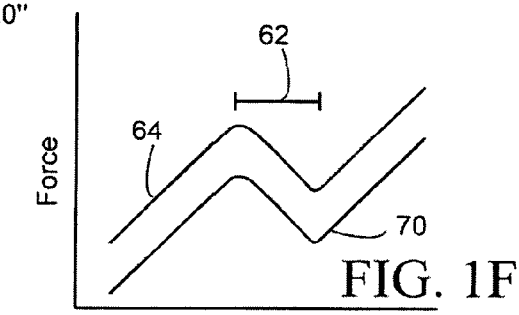
FIGS. 1F-1H are sample force vs. displacement plots illustrating a feature of an embodiment.
Figure 1G:
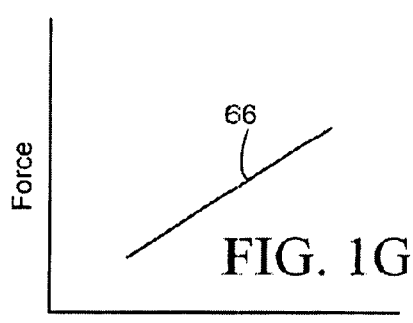
Figure 1H:
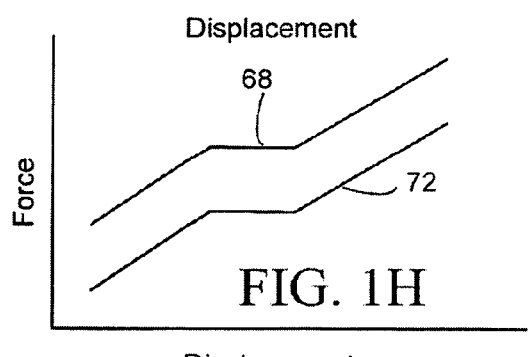
Figure 1I:
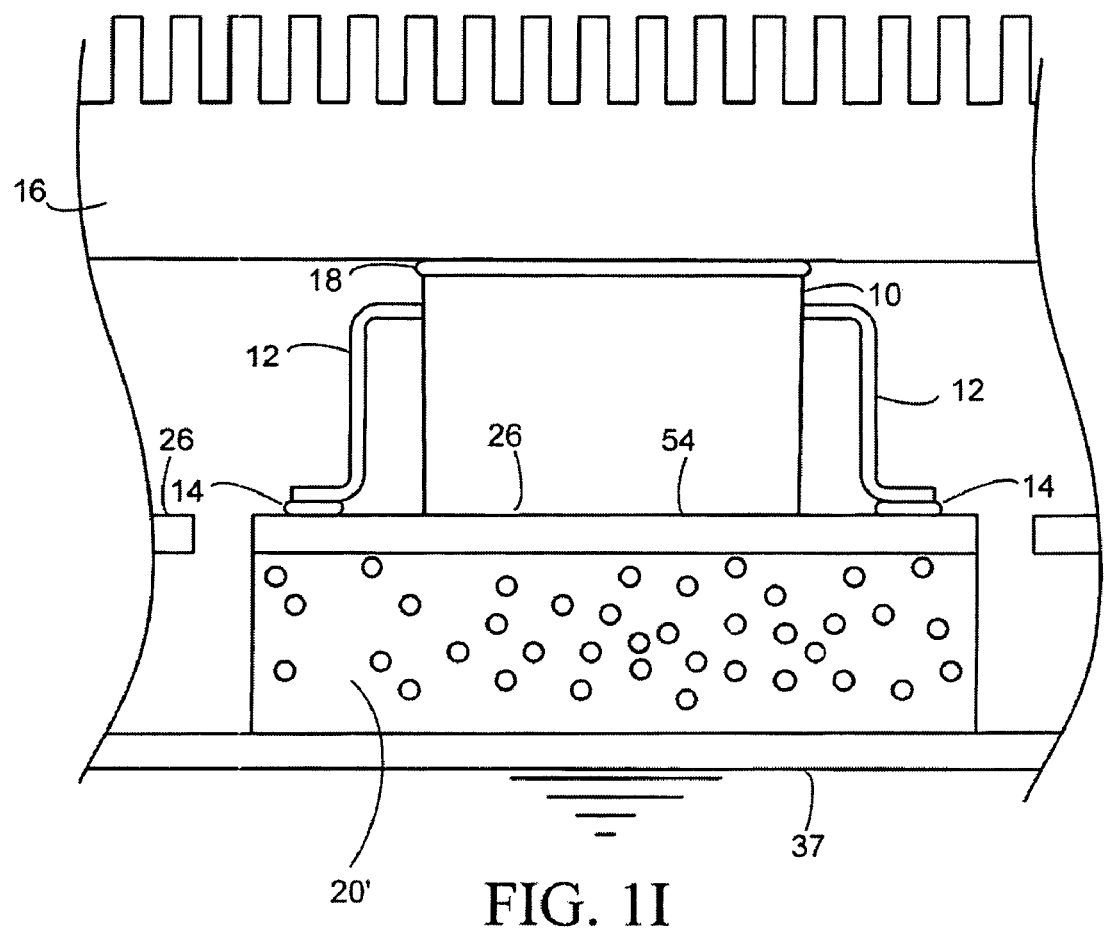

FIGS. 1C, 1D, and 1I show the arrangements of FIGS. 1A and 1B with an additional feature. In FIGS. 1C, 1D and 1I, circuit board 26 is modified so that a portion 54 of the circuit board can move vertically relative to the rest of the circuit board as indicated by arrow 56. Such an arrangement can be provided by, for example, forming cantilevered projections of the circuit board or by cutting slots in the circuit board. The arrangement of FIGS. 1C, 1D, and 1I is advantageous because it permits a greater portion of the force exerted by the force element 20 to be applied to the heat producing device 10. As will be described below, the arrangement of FIGS. 1C, 1D, and 1I is also advantageous because it allows adjustment for dimensional tolerances and non-planarities of the components.

In FIG. 1C, force element 20 is shown as a generalized force element. FIGS. 1D and 1I show two specific examples of suitable force sources. In FIG. 1D, force element 20" is a silicone spring, for example, a frustum shaped spring made of ELASTOSIL® LR 3005 Series liquid silicone rubber commercially available from Wacker Chemie AG (www.wacker.com). Some springs, such as the frustum shaped spring 20" of FIG. 1C may have a buckling mode 60 of FIG. 1E, resulting is a negative spring rate over a portion 62 of a force-displacement curve 64 of FIG. 1F. The combination of the flexing of the circuit board, which may have a substantially constant positive spring rate as shown in curve 66 of FIG. 1G, and the silicone spring 20" may apply a constant force over a range of displacements, as shown in curve 68 of FIG. 1H. Since the force exerted by the silicone spring 20" may decrease with respect to time, for example to curve 70 of FIG. 1F, the combination of the flexing of the circuit board and the silicone spring 20" may also decrease with respect to time, as shown in curve 72 of FIG. 1H. The curves of FIG. 1F-1H are not actual measurements, but are for the purpose of illustrating a feature of the embodiment of FIG. 1D.

In FIG. 1I, the force element 20' is pad or sheet of a compressible material, such as silicone foam. Foam pads or sheets are readily available, inexpensive, and relatively easy to work with.

The materials shown in FIGS. 1D and 1I have the desirable characteristic that the force exerted decreases over time, especially when subjected to heat. The dimensional and the material characteristics of a force source such as silicone springs, silicone foams, or other compressible materials can be selected so that the force initially applied is great enough to provide adequate wetting, but over time decreases so that the force applied is significantly less, but still adequate to provide adequate maintenance force. Materials having the desirable characteristic of exerting a force that decreases over time include many non-metallic materials.

Figure 2:
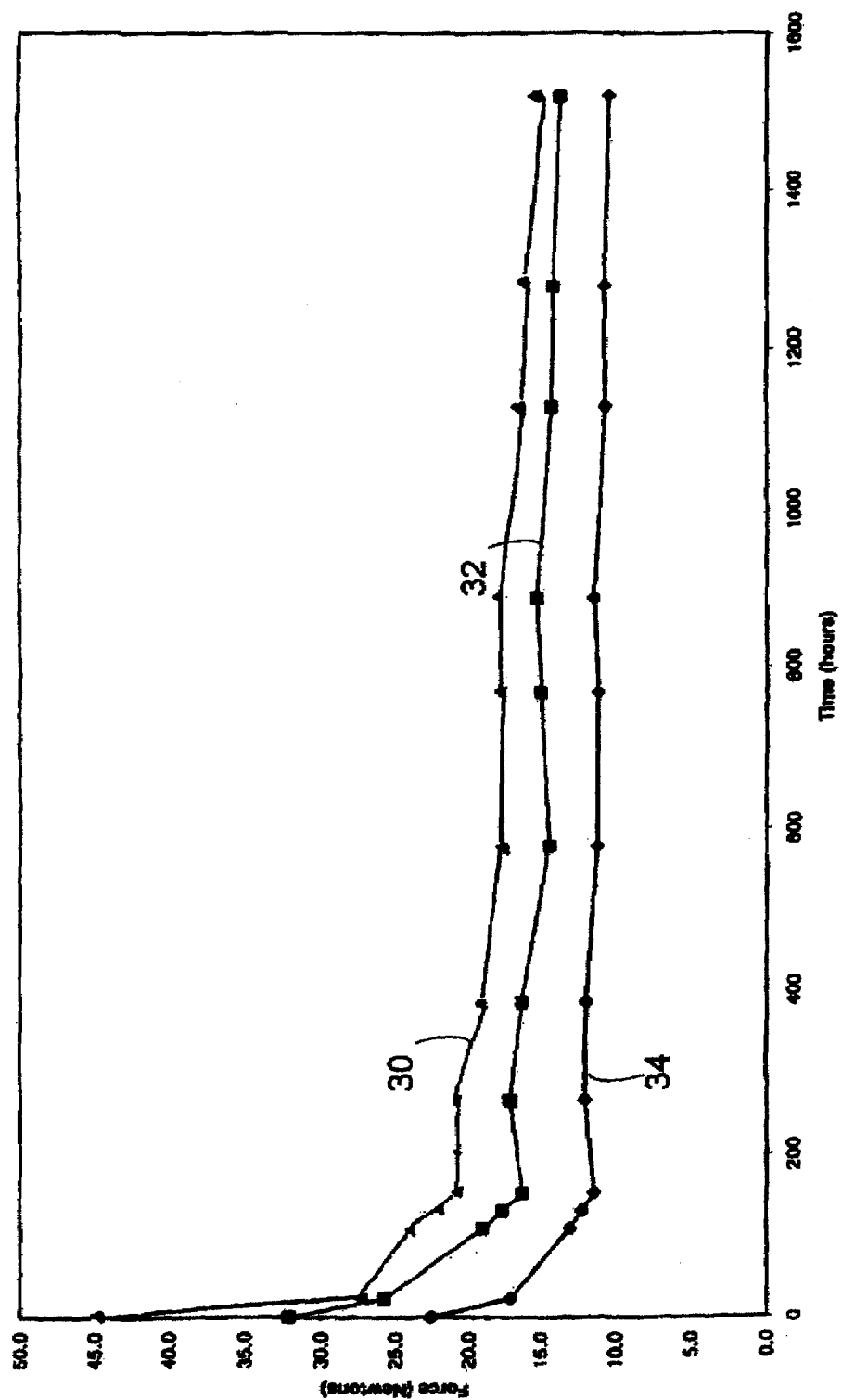
FIG. 2 is a plot of force exerted vs. time.

For example, the curve of FIG. 2 shows the force exerted by a silicone foam marketed as Bisco® HT820 silicone foam and available commercially from the Rogers Corporation of Carol Stream, Ill. The test was performed at 125° C. except for a 114 hour interval in which the temperature was cycled between −40° C. and 85° C. seventy-six times. The vertical scale is force exerted by the force element on a 3.96 $cm^2$ area of circuit board. The force is expressed in Newtons (N). The horizontal scale is time expressed in hours. Curve 30 represents the force exerted by Bisco HT820 foam compressed by 46%. The initial force is about 45 N. At about 154 hours the force has declined to about 21 N and at about 1522 hours has further declined to about 15 N, or about 33% of the initial force. Curve 32 represents the force exerted by Bisco HT820 foam compressed by 33%. The initial force is about 32 N. By about 154 hours the force has declined to about 16 N and at about 1522 hours has further declined to about 14 N or about 44% of the initial force. Curve 34 represents the force exerted by Bisco HT820 foam compressed by 20%. The initial force is about 23 N. By about 154 hours the force has declined to about 11 N and at about 1522 hours has further declined to about 10 N, or about 44% of the initial force. For all three compression percentages the force exerted at 1522 hours is substantially less than 75% of initial force, less than 45% of the force initially exerted for all compression percentages tested, and in one case is as low as 33%.

Typically a pressure of about 27.6 N/ $cm^2$ (40 psi), is sufficient to provide proper wetting. If the heat producing device is a semiconductor chip with a surface area of 0.71 $cm^2$ mounted on the section of circuit board, applying a wetting pressure of 27.6 $N/cm^2$ on the semiconductor chip would require a force of about 19.2 N. A maintenance pressure of at least 6.9 $N/cm^2$ (10 psi) is generally considered sufficient to maintain good thermal contact between the heat sink 16 and the heat producing device. If the heat producing device is a semiconductor chip with a surface area of 0.71 $cm^2$ mounted on the section of circuit board, applying a maintenance pressure of 6.9 $N/cm^2$ on the semiconductor chip would require a force of about 4.9 N.

It can be seen from the curves of FIG. 2 that the all three compression percentages the material has the desirable property that the initial pressure applied is sufficient to provide good wetting and that the pressure declines to a level that is significantly less than the initial pressure, but sufficient to provide good thermal contact. Referring to curve 30 and assuming a semiconductor chip surface area of 0.71 $cm^2$, the initial force 45 N applies a pressure of about 63 $N/cm^2$. The 21 N at 154 hours applies a pressure of about 30 $N/cm^2$ and the 15 N at 1522 hours applies a pressure of about 21 $N/cm^2$, or about 33% of the initial pressure. Referring to curve 32, the initial force is about 32 N applies a pressure of about 45 $N/cm^2$. The 16 N at 154 hours applies a pressure of about 23

N/cm² and the 14 N force at 1522 hours applies a pressure of about 20 N/cm², or about 44% of the initial pressure. In curve 34, the initial force of 23 N applies a pressure of about 32 N/cm². At 154 hours the 12 N force applies a pressure of about 17 N/cm² and the 10 N force at 1522 hours applies a pressure of about 14 N/cm², or about 44% of the initial pressure. For all three compression percentages, the pressure exerted by the force at 1522 hours is substantially less than 75% of the pressure initially exerted by the force, in all cases less than 45% of the pressure initially exerted by the force and in one case is as low as 33%. If the electronic assembly operates at temperatures other than 125° C., the difference between the wetting force and maintenance force may be greater or less than the differences shown in FIG. 2. For semiconductor chips having other surface areas, the appropriate pressure can be attained by varying the dimensions of the compressible sheet or pad or by varying the compression, or by other methods.

Figure 3:
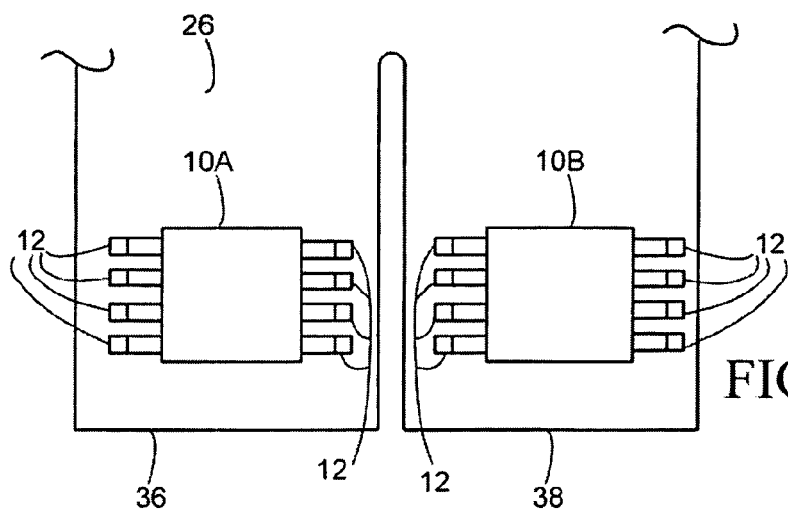
FIG. 3 is a diagrammatic partial top plan view of a circuit board.

FIG. 3 shows an assembly having two heat producing devices 10A and 10B. FIG. 3 does not include the heat sink. The heat producing devices 10A and 10B are mounted on portions 36, 38, which in this case are adjacent, of a circuit board 26 which can move upwardly and downwardly relative to each other and to other portions of the circuit board.

Figure 4:
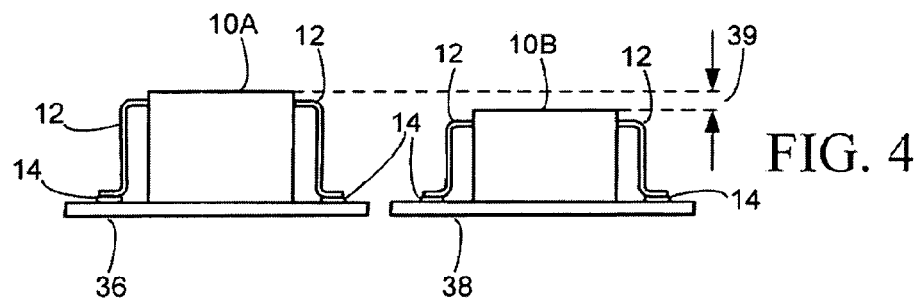
FIG. 4 is a diagrammatic cross section of a circuit board and two heat producing devices.

In FIG. 4 the two chips 10A and 10B differ in height by amount 39 (which is exaggerated for the purpose of illustration). Planarity and dimension differences between the two heat producing devices may also be the result of non-planarities in the circuit board 26, variations in the thickness of the circuit board 26, non-planarities in the heat sink, differences in the thickness of the solder joints 14, and other causes.

Figure 5A:
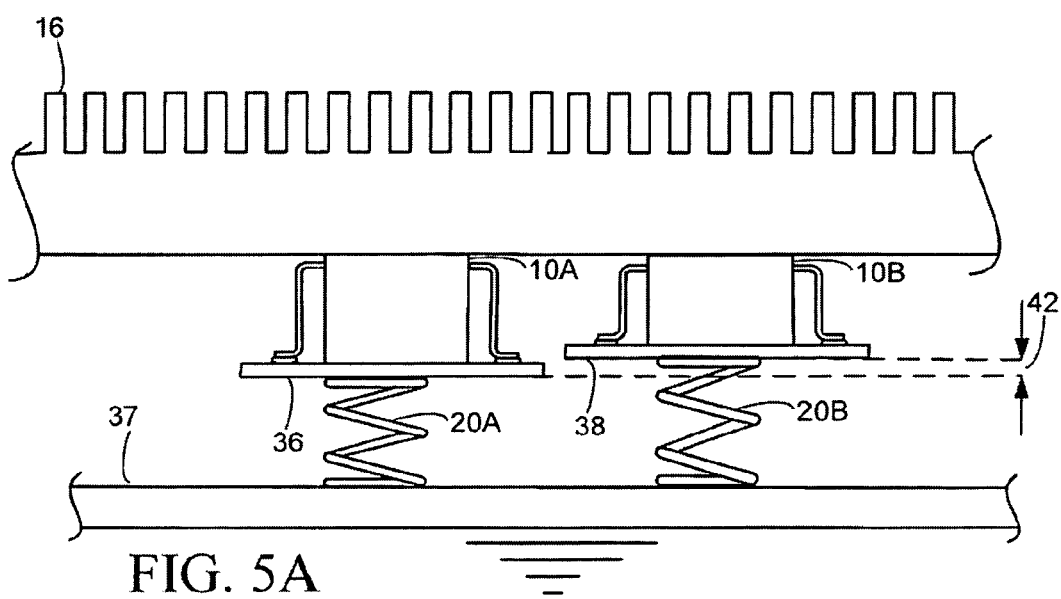
FIGS. 5A-5C are diagrammatic partial cross sections of an electronic assembly.

FIG. 5A shows that if the semiconductor chips are mounted on different circuit board portions that can deflect upwardly and downwardly relative to each other, when the heat sink 16 is in place, portion 36 can flex downward so that the tops of the semiconductor chips 10A and 10B are coplanar, and therefore semiconductor chips 10A and 10B are both in good thermal contact with heat sink 16. Force elements 20A and 20B urge the circuit board portions toward the heat sink. Portions of the circuit board that can move upwardly and downwardly relative to each other and to other portions of the circuit board can be obtained by, for example, forming cantilevered projections of the circuit board or by cutting slots in the circuit board. Flexing or bending of the circuit board 26 to provide the relative movement may have a small (<2 N.) effect on the force exerted on the heat producing devices 10A and 10B and on heat producing device 10 of FIGS. 1C and 1D.

The force elements 20A and 20B are represented schematically by compressed springs. However in an actual embodiment shown in FIG. 5B, the force elements 20A' and 20B' are compressible silicone foam pads. In the embodiment of FIG. 5C, the force elements 20A" and 20B" are different areas of a single silicone foam pad. Additionally, the force elements can be two silicone springs as in FIG. 1D.

Figure 5B:
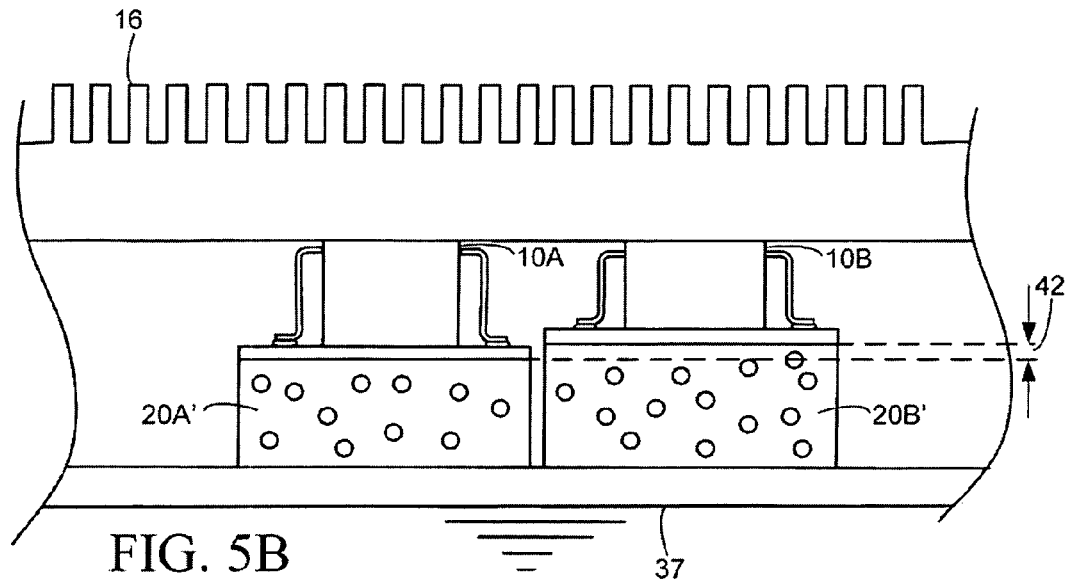
Figure 5C:
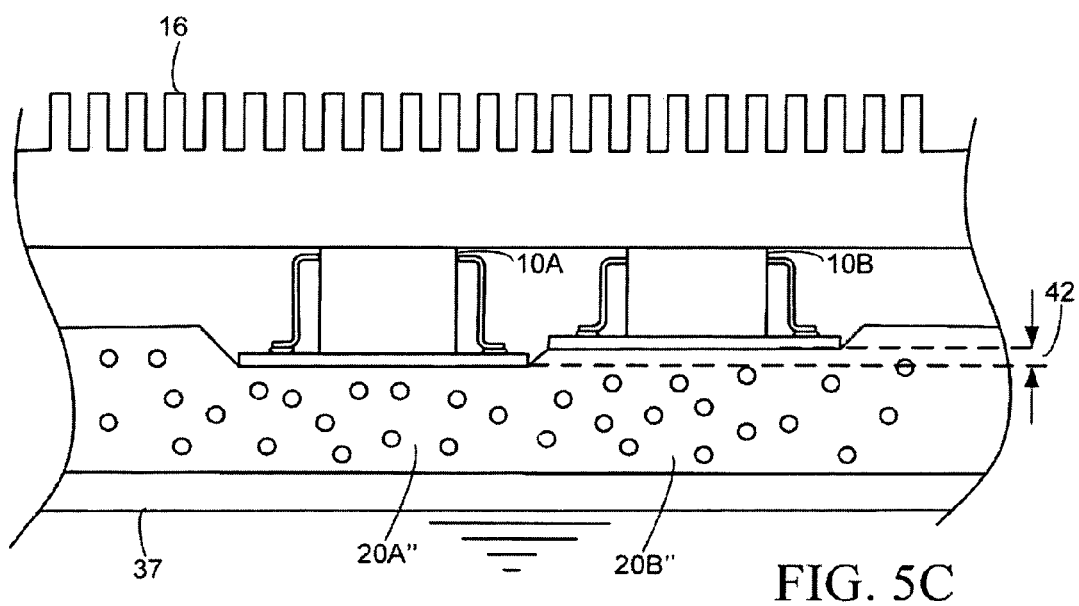

FIGS. 5A-5C show that the deflection of the force elements 20A, 20A', and 20A", respectively are greater by an amount 42 than the deflection of force producing elements 20B, 20B', and 20B", respectively, resulting in greater force being applied by force producing element 20A than force producing element 20B. However as shown in FIG. 2, sheets of silicone foam can be compressed by widely different amounts and still provide both adequate wetting force and adequate maintenance force less than the wetting force.

Other implementations are also within the scope of the claims.

What is claimed is:

1. An electronic assembly, comprising:
   a first heat producing device mounted on a first outer surface of a first portion of a circuit board, wherein the first portion can deflect upwardly and downwardly relative to other portions of the circuit board; and
   a first force element for urging the first heat producing device against a heat sink, wherein the force exerted by the first force element is variable with respect to time, wherein the first force element has a property that if subjected to a temperature of 125° C. for 1522 hours, the first force element exerts a pressure that is less than 75% of and at least 33% of an initial pressure.

2. An electronic assembly according to claim 1, wherein the first portion of the circuit board is a cantilevered projection.

3. An electronic assembly according to claim 1, wherein the first force element is a compressible foam.

4. An electronic assembly according to claim 1, wherein the first force element is a silicone spring.

5. An electronic assembly according to claim 4, wherein the silicone spring has a negative spring rate over a portion of its displacement.

6. An electronic assembly according to claim 1 further comprising
   a second heat producing device mounted on a first outer surface of a second portion of the circuit board;
   wherein the first and second portions can deflect upwardly and downwardly relative to each other and to other portion of the circuit board; and
   a second force element for urging the second heat producing device against a heat sink;
   wherein the second force element has a property that if subjected to a temperature of 125° C. for 1522 hours, the first force element exerts a pressure that is less than 75% of and at least 33% of an initial pressure.

7. An electronic assembly according to claim 6 wherein the first force element and the second force element comprise a silicone spring.

8. An electronic assembly according to claim 7, wherein the silicone spring has a negative spring rate over a portion of its displacement.

9. An electronic assembly according to claim 6, wherein the first force element and the second force element comprise compressible pads.

10. An electronic assembly according to claim 9, wherein the compressible pads comprise silicone foam.

11. An electronic assembly according to claim 1, wherein the first force element exerts the force against a second outer surface of the first portion opposite the first outer surface.

12. An electronic assembly according to claim 1, wherein the first force element has a property that if subjected to a temperature of 125° C. for 1522 hours, the first force element exerts a pressure that is less than 45% of the initial pressure.

13. An electronic assembly according to claim 6, wherein the first force element and the second force element comprise silicone springs.

14. An electronic assembly according to claim 13, wherein each of the silicone springs have a negative spring rate over a portion of the displacement.

15. An electronic assembly, comprising:
   a first heat producing device mounted on a first outer surface of a first portion of a circuit board, wherein the first portion can deflect upwardly and downwardly relative to other portions of the circuit board;

a first force element for urging the first heat producing device against a heat sink, wherein the force exerted by the first force element is variable with respect to time
a second heat producing device mounted on a first outer surface of a second portion of the circuit board;
wherein the first and second portions can deflect upwardly and downwardly relative to each other and to other portion of the circuit board; and
a second force element for urging the second heat producing device against a heat sink;
wherein the force exerted by the second force element is variable with respect to time; and
wherein the first force element and the second force element are different areas of a compressible pad.

16. An audio amplifier, comprising:
a first power amplifier chip mounted on a first outer surface of a first portion of a circuit board;
a second power amplifier chip mounted on the first outer surface of a second portion of the circuit board so that the first portion and the second portion can deflect upwardly and downwardly relative to each other; and
a force source comprising a non-metallic material adjacent a second outer surface of a circuit board to urge the first power amplifier chip and the second amplifier chip against a heat sink with a force that is variable with respect to time,
wherein the force source has a property that if subjected to a temperature of 125° C. for 1522 hours, the force element exerts a pressure that is less than 75% and at least 33% of an initial pressure.

17. An audio amplifier according to claim 16, wherein the force source comprises a silicone spring.

18. An audio amplifier according to claim 17, wherein the silicone spring has a negative spring rate over a portion of its displacement.

19. An audio amplifier according to claim 16, wherein the force source comprises a sheet of silicone foam.

20. An audio amplifier according to claim 16, wherein the compressible pad has a property that if subjected to a temperature of 125° C. for 1522 hours, the force element exerts a pressure that is less than 45% of the initial pressure.

* * * * *